United States Patent [19]

Co et al.

[11] Patent Number: 5,162,888

[45] Date of Patent: Nov. 10, 1992

[54] HIGH DC BREAKDOWN VOLTAGE FIELD EFFECT TRANSISTOR AND INTEGRATED CIRCUIT

[75] Inventors: Ramon Co, Trabuco Canyon; Kenneth W. Ouyang, Huntington Beach; Jui C. Liang, Laguna Niguel, all of Calif.

[73] Assignee: Western Digital Corporation, Irvine, Calif.

[21] Appl. No.: 351,669

[22] Filed: May 12, 1989

[51] Int. Cl.$^5$ ............................................. H01L 27/02
[52] U.S. Cl. .................... 257/408; 361/56; 361/91; 257/355; 257/357; 257/409
[58] Field of Search ............... 357/41, 23.8, 23.4, 357/90, 42, 23.13, 23.1; 361/56, 91

[56] References Cited

U.S. PATENT DOCUMENTS

| | | | |
|---|---|---|---|
| 4,334,235 | 6/1982 | Nishizawa | 357/41 |
| 4,577,391 | 3/1986 | Hsia et al. | 357/42 |
| 4,609,929 | 9/1986 | Jayaraman et al. | 357/23.4 |
| 4,694,313 | 9/1987 | Beasom | 357/41 |
| 4,795,716 | 1/1989 | Yilmaz et al. | 357/42 |
| 4,823,173 | 4/1989 | Beasom | 357/23.8 |
| 4,928,156 | 5/1990 | Alvis et al. | 357/41 |
| 4,928,159 | 5/1990 | Mihara et al. | 357/42 |
| 4,929,991 | 5/1990 | Blanchard | 357/23.4 |
| 4,933,730 | 6/1990 | Shirato | 357/23.8 |
| 4,949,136 | 8/1990 | Jain | 357/23.8 |
| 4,952,994 | 8/1990 | Lin | 357/23.13 |
| 5,017,985 | 5/1991 | Lin | 357/23.13 |
| 5,051,860 | 9/1991 | Lee et al. | 357/23.13 |

FOREIGN PATENT DOCUMENTS 61-214576 9/1986 Japan .................... 357/23.13
1-270273 10/1989 Japan .................... 357/23.13

OTHER PUBLICATIONS

N. H. E. Weste et al., "Principles of CMOS VLSI Design", pp. 224-231, Addison-Wesley Publishing Company.
D. E. Nelsen et al., "Design and Test Results for a Robust CMOS VLSI Input Protection Network", EOS/ESD Symposium Proc., 1986.

Primary Examiner—Rolf Hille
Assistant Examiner—Minhloan Tran
Attorney, Agent, or Firm—Spensley Horn Jubas & Lubitz

[57] ABSTRACT

A field effect transistor device formed on an integrated circuit chip substrate and driven by the on-chip voltages having a well region formed in the substrate, and source and drain regions one of which is formed in the well region. The well region has a lower doping concentration than the source and drain regions and is of the same conductivity type. The well region provides a reduced electric field gradient at the source/substrate or drain/substrate junction and significantly increases the breakdown resistance of the device to DC voltages higher than the on-chip voltages. An input/output protection circuit employing the field effect transistor coupled in series between an integrated circuit output pad and the active devices on the chip providing ability to withstand coupling of the pad to a relatively high DC voltages.

12 Claims, 1 Drawing Sheet

HIGH DC BREAKDOWN VOLTAGE FIELD EFFECT TRANSISTOR AND INTEGRATED CIRCUIT

BACKGROUND OF THE INVENTION

1. Field of the Invention

The present invention relates to solid state semiconductor devices. More particularly, the present invention relates to semiconductor devices formed on integrated circuit chips.

2. Description of the Prior Art and Related Information

Integrated circuit chips are employed in a wide variety of applications. In many of such applications, the integrated circuit chip is placed within an environment not under strict manufacturing control. For example, in a variety of add-on products for use with personal computers and other computer products, systems for providing communication links between computers, and various other electronic systems based in business or similar settings, integrated circuit components are installed in a manner which cannot be carefully controlled by the integrated circuit manufacturer. Similarly, in a wide variety of other applications, integrated circuits are incorporated in systems where precise control over the electronic environment is not possible. In such applications, such integrated circuits may frequently come in contact with sources of voltage or current for which the active semiconductor devices on the chip were not designed.

One such source of undesired high voltages and currents is electrostatic discharge, which typically originates in an electrostatic discharge from a machine or human involved in the assembly or installation process. Considerable effort has gone into designing integrated circuit chips having some ability to resist such potentially damaging electrostatic discharge pulses.

Due to the aforementioned wide variety of end use applications for integrated circuit chips, however, another very dangerous source of high voltages and currents is DC power supplies in the applications environment. More specifically, power supplies, connector cables, high voltage supply rails and various other power sources may often be inadvertently placed in contact with an integrated circuit. For example, integrated circuit pin out S may be connected to a cable which runs close to and in parallel with a power supply cable, in a specific application. Although the voltage level from these sources will typically be much less than from an electrostatic discharge, nonetheless it will often be much higher than the on-board integrated circuit voltage. Since such DC sources provide a continuous current supply rather than a very brief pulse as in an electrostatic discharge event, circuitry designed to protect against electrostatic discharge events will in general not be effective to prevent against damage from such continuous DC sources. For example, a typical electrostatic discharge protection circuit design with a parallel discharge current path to circuit ground will not save an integrated circuit chip from destruction from accidental connection to such a DC source. Rather, the DC power source will continue to flow with high current through the short to the integrated circuit chip ground until the chip is destroyed by overheating, or the DC source is drained or shorted out. In either case, a typical consequence will be shutting down of the entire system of which the integrated circuit chip forms a part, as well as loss of the chip itself.

These considerations are further aggravated by the increasing sensitivity of modern VLSI chips due to the dense packing and small device geometries employed therein. Such modern densely packed VLSI chips are much more subject to breakdown at one or more of the active devices on the chip, in response to coupling to a higher voltage than the on-board chip voltage, due to the crowding together of junctions potentially subject to breakdown conduction Additionally, such modern VLSI chips are much more likely to be destroyed by sustained exposure to a DC current since a sensitive portion of the circuit is more likely to be in the current path. Since the trend is to ever smaller device geometries, and hence lower breakdown voltages for the active devices employed therein, the tendency to failure of integrated circuit chips configured adjacent DC power sources will be further increased.

Accordingly, a need presently exists for an improved integrated circuit design allowing resistance to damage caused by coupling to DC power sources. A need further exists for an active semiconductor device capable of withstanding relatively high DC voltages.

SUMMARY OF THE INVENTION

The present invention provides an improved field effect transistor device having increased resistance to breakdown due to large sustained DC voltages.

The present invention further provides an improved integrated circuit chip capable of withstanding accidental connection to large DC voltage supplies without shorting or device breakdown.

The present invention further provides an improved integrated circuit design fully compatible with modern VLSI process technologies.

In a preferred embodiment, the present invention provides a field effect transistor structure having source, channel and drain regions, formed in an integrated circuit substrate, with at least one of the source or drain regions formed in a well region of the same conductivity type. For example, in an embodiment providing an n channel field effect transistor device, with n+ source and drain regions formed in an integrated circuit p type substrate, the source or drain n+ region subject to connection to a high voltage source is formed in an n− well region in the p type substrate. A gate oxide and gate structure are in turn provided over the region between the source and drain. The gate oxide thickness is chosen to provide a threshold voltage for the device compatible with the integrated circuit on-board voltages. That is, the device will be turned on and off by the same on-chip voltages as conventional active field effect devices. An effective channel under the gate is thus formed by a p− portion of the substrate and the lateral edge of the n well region. The source, drain and gate electrode connections may be made in a conventional manner. If conventional n well CMOS process technology is employed to form the source, drain and n well regions, the n well will be approximately 10 times the depth of the n+ source region.

It has been found that the placing of the source or drain region of the field effect transistor in a well region of the same conductivity type provides a significantly increased breakdown voltage for the device. For example, using a conventional CMOS n well 1 micron process, the breakdown voltage of a field effect transistor may be more than doubled by the improved structure of the present invention. (For example, from approximately 7 volts DC to 28 volts DC.) It is believed that the increase in breakdown voltage is due to the n well providing a reduced electric field gradient at the n well-/substrate junction.

The present invention further provides an improved integrated circuit employing the aforedescribed field effect transistor device in series with an output pad potentially subject to high DC voltages and the other active semiconductor devices formed on the integrated circuit. In a preferred embodiment, the field effect transistor structure is coupled as a transfer gate between the pad and other active devices on the integrated circuit by having a fixed voltage applied to the gate thereof. Thus, during normal operations, the transfer gate provides a direct current path between the pad and semiconductor devices, with the n well/substrate junction being forward biased. During accidental coupling of the integrated circuit pad to a large DC voltage of the opposite polarity, however, the n well/substrate junction becomes reverse biased and the current flow across the transfer gate is shut off. Due to the high breakdown voltage of the field effect transistor device employed in the transfer gate, DC voltages of 15 volts or more may be applied to the pad for an extended period without causing breakdown of the transfer gate and destructive shorting from the pad into the integrated circuit.

Accordingly, the present invention provides an improved field effect transistor structure and improved integrated circuit chip design which provides effective protection against accidental coupling of the integrated circuit and/or field effect transistor to a relatively high DC voltage source.

Further advantages of the present invention will be appreciated from the following detailed description of the invention.

DESCRIPTION OF THE INVENTION

Figure 1:
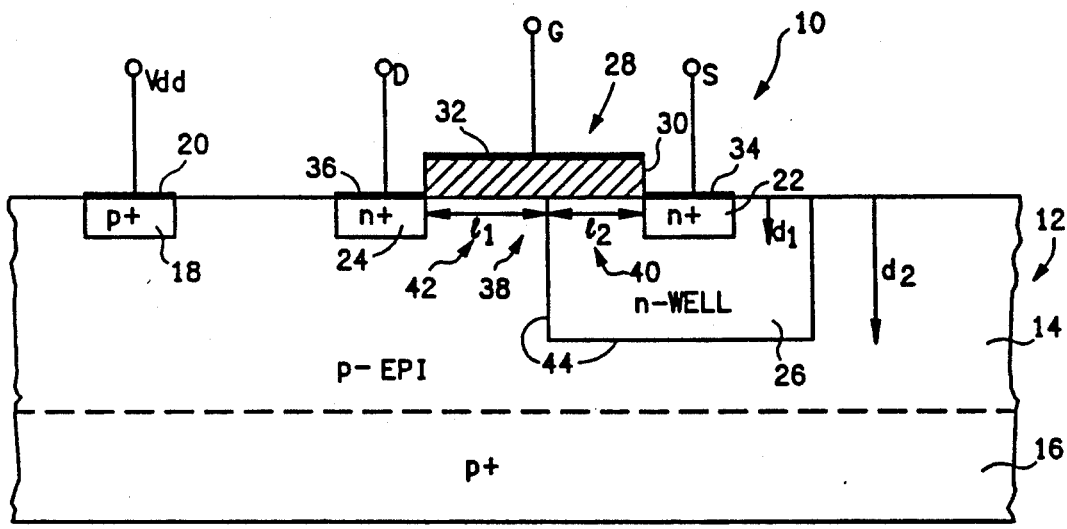
FIG. 1 is a cross sectional view of an n channel field effect transistor of the present invention formed in an integrated circuit substrate.

Referring to FIG. 1, a preferred embodiment of the field effect transistor device 10 of the present invention is illustrated in cross-section. The preferred embodiment illustrated in FIG. 1 is of an n channel field effect transistor device, however, it will be appreciated that the present invention is equally applicable to p channel field effect transistors, as well as field effect transistor structures made from other semiconductor materials such as GaAs and other well known materials.

As illustrated in FIG. 1, the n channel field effect transistor 10 is preferably formed in a semiconductor substrate 12 which may form a part of a CMOS (Complementary Metal Oxide Semiconductor) or n MOS integrated circuit. As shown in FIG. 1, the substrate 12 includes a p− epitaxial layer 14 formed on top of a more highly doped p+ body portion 16, with the n channel field effect transistor 10 formed directly in the p− epitaxial layer 14. It will be appreciated by those skilled in the art, however, that various process technologies may employ different substrate configurations and doping profiles for formation of n channel field effect transistor 10. Also, it will be appreciated that the relative dimensions shown in FIG. 1 are not to scale for space considerations, and for example, epitaxial layer 14 will typically be much smaller than body portion 16. For example, in conventional modern CMOS processes, the epitaxial layer 14 may typically be approximately 10-20 microns deep and the body portion 16, approximately 500-600 microns deep. P type substrate 12 is coupled to a reference potential, shown as $V_{dd}$ in FIG. 1, through a p+ contact diffusion 18 and contact metallization 20. The value of reference potential $V_{dd}$ is dependent upon the specific application, however, for modern CMOS integrated circuits $V_{dd}$ will typically be approximately +5 volts. Therefore, a reference volta $V_{dd}$ of +5 volts will also be the maximum voltage applied to the active devices formed in the integrated circuit during proper installation and operation thereof.

Still referring to FIG. 1, n channel device 10 includes n+ source and drain regions 22, 24, respectively, and deeper n well region 26. The n+ drain region 24 and n well 26 are formed directly into p− epitaxial layer 14. The n+ source region 22, however, is formed in n well region 26. N well region 26 may be of the type employed in n well or twin tub CMOS technology. N wells employed in such CMOS processes typically have an n− conductivity, for example, formed by doping silicon with phosphorus to approximately to $10^{15}$ atoms/cc. In contrast, n+ regions 22 and 24 will have significantly higher doping concentrations, for example, formed by doping silicon with arsenic to approximately $10^{19}$ atoms/cc. Additionally, n well region 26 will extend a distance $d_2$ into the p− epitaxial layer 14, substantially greater than depth $d_1$ of n+ source region 22 and n+ drain region 24. For example, in a presently preferred CMOS implementation $d_1$ may be approximately 0.3 microns and $d_2$ approximately 4 microns. In general, the values of $d_1$ and $d_2$ may be varied considerably, however, $d_2$ should be approximately 2-20 times the depth of $d_1$.

As shown in FIG. 1, a gate structure 28 is formed over the region between spaced apart source and drain regions, 22, 24, respectively. The gate structure 28 includes a gate oxide 30, such as, for example, $SiO_2$, with a thickness which may be conventional for active field effect devices. The field effect transistor structure 10, being designed as an active device, i.e., a device that is turned on and off by gate voltages supplied to gate 28 which correspond to the on-board chip voltages, it will in general be characterized by ratios of the the gate oxide thickness to active channel length suitable to provide appropriate threshold turn on voltages for the device 10. For example, for typical on-board voltages $V_{dd}$ of ±5 volts, the gate oxide 30 should be no thicker than approximately 1000 Å for a 2-3 micron channel length $l_1$ to allow suitable threshold voltages for the device. For example, in current CMOS 1 micron processes with $V_{dd}$ approximately +5 volts, the gate oxide 30 may be approximately 200-300 Å thick. The gate oxide 30 is in turn covered with a gate electrode 32, preferably of polysilicon. The gate electrode 32 is in turn coupled via metallization illustrated schematically in FIG. 1, to a gate potential G. Also as shown in FIG. 1, the source and drain regions 22, 24 are coupled via metallization layers 34, 36, to source and drain potentials S, D, respectively.

The gate structure 28, defines an effective channel region 38, between source region 22 and drain region 24. Due to the presence of a portion of n well 26 under the gate structure 26, a portion of the effective channel region 38 includes an n well channel region 40. The active channel region, i.e., the portion of the channel 38 which is turned on by the gate potential G, is formed by p− region 42. This thus gives the channel region 38 a two conductivity type structure, with n type region 40 operating in an accumulation mode in response to positive potentials applied to gate 28 and p type region 42 operating in an enhancement mode in response to such positive gate potentials. The respective lengths of p type region 42 and n type region 40, $l_1$ and $l_2$, respectively, are preferably chosen to provide a suitable active channel length $l_1$; for example, approximately 1-2 microns. Due to the more extended diffusion of n well region 26, however, which results in less sharp boundaries of such region, the spacing $l_1$ may be chosen to be somewhat larger than in a more conventional active devices, for example, 3.5 microns to ensure a suitable active channel length of p− conductivity type. The length $l_2$ will in turn be chosen by the relative size and spacing of n well 26 and n+ source region 22. For example, a length $l_2$ of 2.5 microns would correspond to a n well length of approximately 6.5 microns and a source region 22 length of 1.5 microns, spaced in the middle of the n well 26. It will be appreciated, however, that substantial modifications in the dimensions of regions $l_2$ and $l_1$ may be made without departing from the scope of the present invention.

The overall width of the field effect transistor structure 10, i.e., the dimension of the device extending in the direction perpendicular to the page in the cross-section of FIG. 1, will generally depend on the specific application of the device. For example, when employed adjacent an input/output pad in an integrated circuit chip, as will be discussed in more detail below, a relatively wide structure, for example, 2000-3000 microns may be employed to provide a buffering function. Much smaller dimensions may be employed for other applications, however.

The field effect transistor structure of the present invention provides a significantly increased resistance to breakdown in response to coupling of the device to a relatively high DC voltage. For example, in the embodiment illustrated in FIG. 1, the device 10 will have a significantly enhanced resistance to DC voltages applied to source electrode 34. It is believed that in conventional field effect transistor devices having a direct contact between an n+ source region and a p type substrate, breakdown in response to a relatively high DC voltage will occur across such junction and cause current flow into the substrate. This would then typically flow to the substrate contact and through to an integrated circuit reference potential (such as $V_{dd}$ illustrated in FIG. 1) eventually heating up and destroying the chip. In the structure of the present invention, however, no direct n+/p substrate junction is present at the high voltage electrode. Rather, as shown in FIG. 1 the junction at the source electrode is between the p type substrate with the n well region 26 at p/n junction 42. Since junction 42 is between a lightly doped n− region 26 and a lightly doped p− region 14, the depletion region across the junction 42 in response to a large potential difference across the junction created by the DC voltage, will be quite large. Accordingly, the electric field gradients across junction 42 will be significantly reduced relative to such fields across an n+/p substrate junction. Since the tendency of the junction to avalanche and break down is related to the strength of the electric field across the junction, it will be appreciated that the reduced electric field gradient reduces such likelihood. In tests of such structure, it has been found that the present invention serves to very significantly increase the resistance to breakdown in response to an applied DC voltage. For example, resistance to DC voltages of 28-31 volts was obtained in comparison to breakdown voltages of approximately 7 volts in conventional n channel field effect transistor structures.

It will be appreciated, that the n well region is desired around the source or drain region which will be subject to contact with the relatively high DC voltage. Therefore, while the embodiment illustrated in FIG. 1 has the n well region 26 surrounding source region 22, for an application where the drain 24 would potentially be subject to high voltage contacts, the n well region will preferably be located about region 24. Similarly, where the potential for electrical contact to relatively high voltages is possible at both the source and drain regions, two n well structures may be employed. Furthermore, while the embodiment of FIG. 1 is illustrated with respect to n channel field effect transistor device 10, employing an n well region 26, it may equally be employed in a p channel device by using a p well region about the source and/or drain regions. Similarly, other semiconductor field effect transistor devices may similarly advantageously incorporate the well structure of the present invention.

Since conventional CMOS n well or twin tub processes inherently employ n wells, and/or p wells in the case of p well or twin tub processes, it will be appreciated that the present invention may be implemented with no additional mask steps over a conventional CMOS process. For example, in a conventional n well CMOS process, a mask step is required to lay out the n wells where the p channel devices will ultimately be formed. The present invention will employ modification of this mask layout to add additional n wells in which n+ source and/or drain regions requiring increased breakdown resistance will be formed. The conventional mask layout for the n+ source and drain regions will in turn be modified to align the appropriate source and/or drain regions with the added n wells. Also, the layout may be modified to increase somewhat the source to drain spacing to provide for the additional n well region under the gate structure. The spacing of the source and/or drain region formed in the n well with respect to the gate structure may be achieved by using a self-aligned implant process to ensure that the edge of the n+ regions are aligned with the edge of the gate oxide. This will in turn allow the length of the effective channel 38 to be kept to a minimum and the length of the n well channel region 40 to be carefully controlled.

Figure 2:
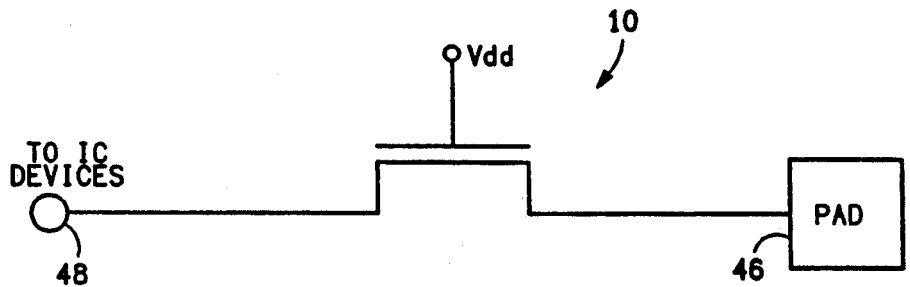
FIG. 2 is an electrical schematic drawing illustrating an improved integrated circuit input/output circuit design employing a transfer gate using the improved field effect transistor of the present invention.

Referring to FIG. 2, an electrical schematic drawing illustrates the field effect transistor 10 of the present invention employed as a transfer gate coupled in series between an integrated circuit chip pad 46 and an electrical connection 48 to other active devices on the integrated circuit chip. The improved integrated circuit input/output circuit illustrated in FIG. 2 may advantageously be employed in applications where the input/output pad 46 may be inadvertently coupled to a DC voltage source. The transfer gate structure formed by device 10 with the gate thereof coupled to $V_{dd}$ is placed in series between the input/output pad 46 and the devices on the integrated circuit coupled to line 48 to prevent breakdown conduction in response to such a DC voltage on pad 46. More specifically, during normal circuit operations, the potential $V_{dd}$ applied to field effect transistor 10 will maintain the device 10 in a conduction mode and allow current flow between connection 48 and pad 46. Application of a large positive DC voltage to pad 46, however, will reverse bias the source/substrate and source/channel junction in the field effect transistor 10. This will turn off the device 10 and insulate electrical connection 48, and the devices coupled thereto, from the potentially destructive high voltage on pad 46. Due to the aforedescribed increased breakdown characteristics of the source/substrate junction of the device 10, that junction will be able to withstand a high DC voltage on pad 46, for example, a DC voltage of +15 volts such as provided by power supplies commonly found in electronics applications. Accordingly, even for sustained contacts to such DC voltage, no current flow will result and no permanent damage will result from the inadvertent coupling of the integrated circuit pad 46 to the high voltage DC power supply.

Accordingly, it will be appreciated that the present invention provides an improved field effect transistor structure capable of resisting breakdown in response to relatively high DC voltages. Additionally, the present invention provides an improved integrated circuit input/output circuit which prevents destruction of the circuit in response to accidental coupling to DC voltages present in various specific applications.

While the foregoing invention has been described in terms of a preferred embodiment, it will be appreciated that a wide variety of modifications may be made while remaining within the scope of the present invention. Accordingly, the present invention should not be limited to the aforedescribed embodiments and illustrated applications.

What is claimed is:

1. A field effect transistor device, formed in a substrate having an upper major surface, the substrate having a layer of a semiconductor material of a first conductivity type, comprising:
   a well region of a second conductivity type semiconductor material formed in said upper major surface of said substrate, said well region having a doping concentration of approximately $10^{15}$ dopant atoms/cc and extending into said substrate to a depth of approximately 4 microns or greater;
   a first highly doped region of said second conductivity type semiconductor material formed within said well region, said first highly doped region having substantially higher conductivity than said well region;
   a second highly doped region of said second conductivity type semiconductor material formed in said upper major surface of said substrate at a position spaced apart from said first highly doped region and said well region, said second highly doped region having substantially higher conductivity than said well region, said spaced apart first and second highly doped region defining a channel region therebetween;
   a gate oxide layer formed over said channel region, said gate oxide layer having a maximum thickness of approximately 100–1000 Å;
   a gate electrode formed on said gate oxide;
   a first contact electrode formed on said first highly doped region; and
   a second contact electrode formed on said second highly doped region.

2. A first effect transistor device as set out in claim 1, wherein said well region has a depth into the upper major surface of said substrate of 2–20 times that of said first highly doped region.

3. A field effect transistor device as set out in claim 1, wherein said first conductivity type semiconductor material is p type doped silicon and said second conductivity type semiconductor material is n type doped silicon and wherein said well region is doped n− and said first highly doped region is doped n+.

4. A field effect transistor device as set out in claim 3, wherein said first highly doped region is doped with arsenic at approximately $10^{19}$ atoms/cc and said well region is doped with phosphorus at approximately $10^{15}$ atoms/cc.

5. A field effect transistor device as set out in claim 4, wherein said first highly doped region is approximately 0.3–0.4 microns deep and said well region is approximately 4–20 microns deep.

6. A field effect transistor device as set out in claim 1, wherein said first conductivity type semiconductor material is n type doped silicon and said second conductivity type semiconductor material is p type doped silicon and wherein said well region is doped p− and said first highly doped region is doped p+.

7. A field effect transistor device as set out in claim 1, wherein said gate oxide is approximately 200–300 Å thick.

8. A field effect transistor device as set out in claim 1, wherein said first contact electrode is coupled to a source potential and said second contact electrode is coupled to a drain potential.

9. A field effect transistor device as set out in claim 1, wherein said first contact electrode is coupled to a drain potential and said second contact electrode is coupled to a source potential.

10. A field effect transistor device as set out in claim 1, further comprising a second well region of said second conductivity type semiconductor material formed in said upper major surface of said substrate, wherein said second highly doped region is formed in said second well region.

11. A field effect transistor device as set out in claim 1, wherein said channel region is approximately 3.5 microns in length.

12. An integrated circuit chip input/output circuit for coupling an integrated circuit chip to an external electrical connection, said integrated circuit chip having a semiconductor substrate with an upper major surface, a plurality of active field effect transistor devices formed on said substrate, and sources of first and second reference potentials for turning said active field effect transistor devices on and off, comprising:
   an electrical contact pad formed on said substrate;
   an electrical lead for coupling electrical signals applied to said pad to at least one of said plurality of active field effect transistor devices formed on said substrate; and
   a field effect transistor, electrically coupled in series with said pad and said electrical lead, said field effect transistor comprising a well region of a first conductivity type formed in said semiconductor substrate, a source region and a drain region of said first conductivity type having a higher doping concentration than said well region, said source and drain regions being spaced apart on said upper major surface of said semiconductor substrate, wherein one of said source region and said drain region is formed in said well region, and wherein said source and drain region are spaced apart to define a channel region including a portion of said well region and a region of second conductivity type formed in said semiconductor substrate, and a gate structure formed on said channel region, said gate structure being coupled to said first reference potential to maintain said transistor in a normally on condition;

wherein said well region has a depth of approximately 4 microns, a length of approximately 6.5 microns and a width of approximately 2000-3000 microns.

* * * * *